United States Patent
Rimondi et al.

(10) Patent No.: US 6,963,499 B2
(45) Date of Patent: Nov. 8, 2005

(54) STATIC RAM WITH FLASH-CLEAR FUNCTION

(75) Inventors: Danilo Rimondi, Mozzo (IT); Cosimo Torelli, Cernusco Sul Naviglio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/331,135

(22) Filed: Dec. 27, 2002

(65) Prior Publication Data

US 2003/0231538 A1 Dec. 18, 2003

(30) Foreign Application Priority Data

Dec. 28, 2001 (EP) .............................. 01830819

(51) Int. Cl.⁷ ................................. G11C 7/00
(52) U.S. Cl. ................... 365/154; 365/189.01
(58) Field of Search ................. 365/154, 189.01, 365/156, 190

(56) References Cited

U.S. PATENT DOCUMENTS

| | | | | | |
|---|---|---|---|---|---|
| 3,631,411 | A | * | 12/1971 | Kosonocky | 365/238 |
| 4,780,847 | A | * | 10/1988 | Ito | 365/154 |
| 4,928,266 | A | * | 5/1990 | Abbott et al. | 365/189.01 |
| 4,949,308 | A | | 8/1990 | Araki et al. | |
| 5,212,663 | A | * | 5/1993 | Leong | 365/189.01 |
| 5,285,420 | A | * | 2/1994 | Shibue | 365/218 |
| 5,329,492 | A | * | 7/1994 | Mochizuki | 365/230.01 |
| 5,373,466 | A | * | 12/1994 | Landeta et al. | 365/189.01 |
| 5,383,153 | A | * | 1/1995 | Sato et al. | 365/155 |
| 5,523,710 | A | | 6/1996 | Miyaki et al. | |
| 6,469,930 | B1 | * | 10/2002 | Murray | 365/185.08 |

FOREIGN PATENT DOCUMENTS

| EP | 0 500 958 A1 | 9/1992 |
|---|---|---|
| JP | 56069923 | 11/1981 |

OTHER PUBLICATIONS

European Search Report for EP 01 83 0819, Jun. 14, 2002.

* cited by examiner

*Primary Examiner*—Vu A. Le
(74) *Attorney, Agent, or Firm*—Lisa K. Jorgenson; Bryan A. Santarelli; Graybeal Jackson Haley LLP (57) ABSTRACT

A memory cell comprises a first and a second inverters connected in a latch configuration. The inverters have respective first and second means for receiving a first and a second voltage supplies, respectively. The cell also comprises means, responsive to a memory cell selection signal, for selectively connecting an input of at least one of the first and second inverter to at least one respective input/output data line, carrying an input datum to be written in the memory cell in a memory cell write operation and an output datum read from the memory cell in a memory cell read operation. For flash-clearing the memory cell, means are provided for switching at least one of the first and second voltage supply receiving means of at least one of the first and second inverters between the first voltage supply and the second voltage supply. The memory cell is particularly adapted to implement a flash-clear function in a memory device.

16 Claims, 5 Drawing Sheets

STATIC RAM WITH FLASH-CLEAR FUNCTION

PRIORITY CLAIM

This application claims priority from European patent application No. 01830819.7, filed Dec. 28, 2001, which is incorporated herein by reference.

TECHNICAL FIELD

The present invention relates generally to the design of very large or ultra large scale integrated circuits (VLSI or ULSI), in particular semiconductor memories. More particularly, the invention concerns a static random access memory (static RAM or SRAM) having a flash-clear function.

BACKGROUND

Some conventional SRAMs feature a function, called in jargon flash-clear, by which all of the memory cells are set at a time in a prescribed state (conventionally, a "0" logic state). The flash-clear function, triggered upon assertion of a control signal external to the memory, allows initialising the memory, e.g. for resetting or testing purposes.

Conventionally, the memory flash clear is performed by simultaneously selecting all the word lines of the memory cell array, so as to select all the memory cells, and forcing all the bit lines of the memory cell array to the reference potential (ground). In this way, all the memory cells switches to the "0" logic state.

A drawback of this approach, especially for medium- or large-size memory cell arrays, is the relatively high peak value of the current sunk by the memory during the flash-clear operation. The supply voltage level and the reference voltage level seen by the memory can in fact be affected by the relatively high peak current to such an extent as to undermine the functionality of part or all of the integrated circuit. In the worst case, the integrated circuit may be damaged or even destroyed by electromigration phenomena.

One solution proposed to overcome this problem by reducing the flash-clear peak current is disclosed in U.S. Pat. No. 4,949,308. The memory cell array is divided into a plurality of memory cell groups which are driven at mutually different timings for flash-clearing by means of a plurality of delay circuits connected in cascade, to which the flash-clearing signal is applied.

The solution proposed in that document imposes changes to the row and column decoding circuits. As a consequence, it cannot be easily implemented in existing SRAM designs lacking the flash-clear function.

SUMMARY

In view of the state of art discussed, an embodiment of the present invention provides a new flash-clear scheme, particularly adapted to be easily implemented in existing SRAM designs lacking such a feature.

In brief, a memory cell according to an embodiment of the invention comprises a first and a second inverter connected in a latch configuration; the first and second inverters having respective first and second means for receiving a first and a second voltage supplies (VDD,GND), respectively.

Means responsive to a memory cell selection signal are provided, for selectively connecting at least one of the first and second inverter inputs to at least one respective input/ output data line, carrying an input datum to be written in the memory cell in a memory cell write operation and carrying an output datum read from the memory cell in a memory cell read operation.

The memory cell further comprises means for switching at least one of the first and second voltage supply receiving means of at least one of the first and second inverters between the first voltage supply and the second voltage supply, for clearing the memory cell.

Another embodiment of the memory device comprises a plurality of memory cells, each one comprising a first and a second inverter connected in a latch configuration; the first and second inverters have respective first and second means for receiving a first and a second voltage supplies, respectively.

The memory device comprises memory cell flash-clear means for switching at least one of the first and second voltage supply receiving means of at least one of the first and second inverters of the memory cells between the first voltage supply and the second voltage supply, for clearing the memory cells.

BRIEF DESCRIPTION OF THE DRAWINGS

The features and advantages of the present invention will appear from the following detailed description of some embodiments thereof, provided merely by way of non-limitative examples, which will be made in connection with the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
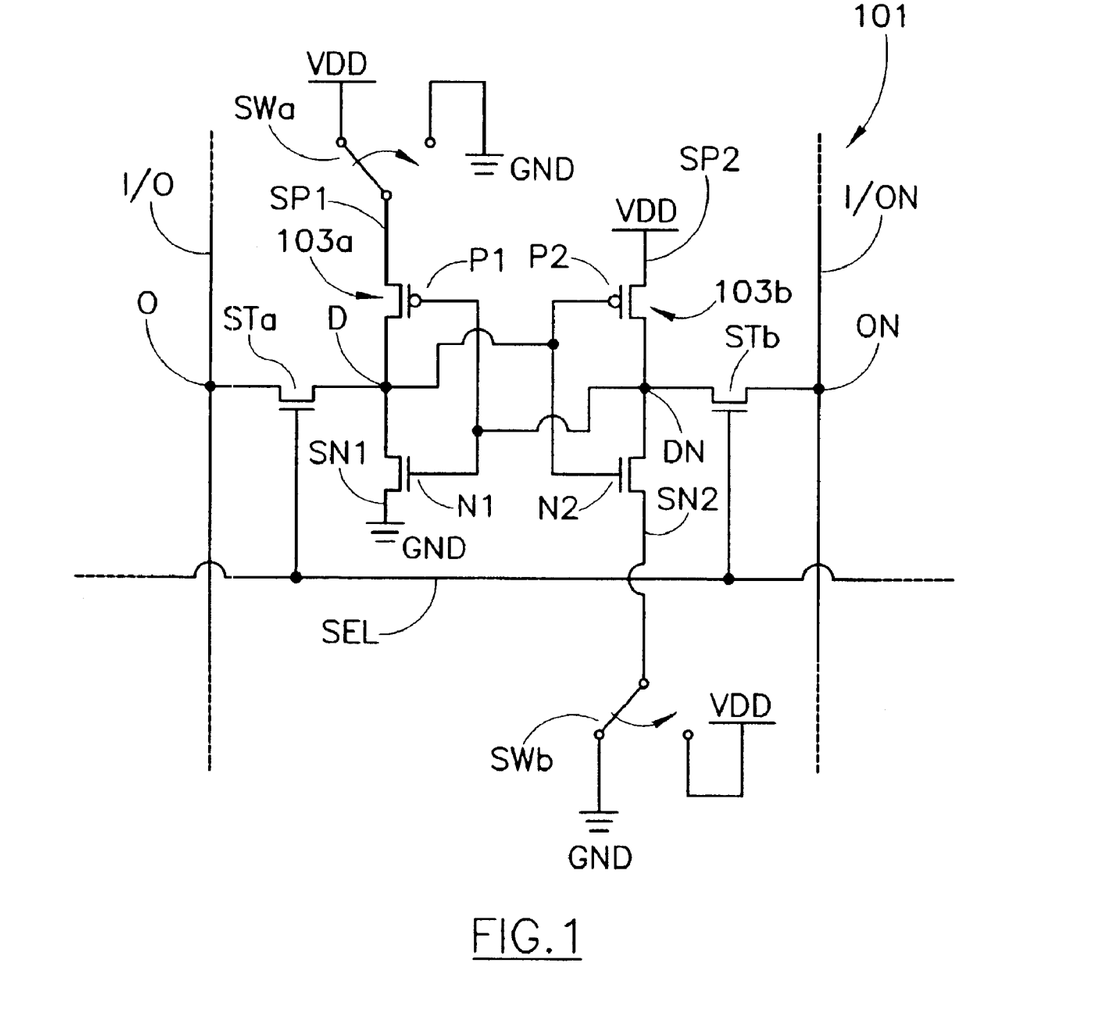
FIG. 1 is a circuit diagram of a SRAM memory cell according to an embodiment of the present invention.

With reference to the drawings, in FIG. 1 a six-transistors CMOS SRAM memory cell according to an embodiment of the present invention is shown. The memory cell, globally identified by 101, conventionally comprises a first and a second CMOS inverters 103a, 103b cross-connected in a latch configuration: an output of the first inverter 103a and an input of the second inverter 103b are connected to a same, first circuit node D; an input of the first inverter 103a and an output of the second inverter 103b are connected to a same, second circuit node DN.

The first circuit node D is selectively connectable, through a first selection transistor STa, to a first memory cell input/output node O; the second circuit node DN is selectively connectable, through a second selection transistor STb, to a second memory cell input/output node ON. The first and second selection transistors STa, STb are for example N-channel MOSFETs with respective gates connected to a memory cell selection signal line SEL. The first and second memory cell input/output nodes O and ON are connected to respective input/output signal lines I/O and I/ON.

Each one of the first and second inverters 103a, 103b conventionally comprises a P-channel MOSFET P1, P2 and an N-channel MOSFET N1, N2 connected in series to each other. In conventional SRAM memory cells, the serially-connected MOSFETs P1, N1 and P2, N2 of the first and second inverters 103a, 103b are connected between a supply voltage rail VDD and a reference voltage rail (ground) GND. According to an embodiment of the present invention, a source SP1 of the P-channel MOSFET P1 of the first inverter 103a can be selectively switched between the supply voltage rail VDD and the reference voltage rail GND, by means of first switching means schematised by a first switch SWa; additionally, a source SN2 of the N-channel MOSFET N2 of the second inverter 103b can instead be selectively switched between the reference voltage rail GND and the supply voltage rail VDD, by means of second switching means schematised by a second switch SWb. A source SN1 of the N-channel MOSFET N1 of the first inverter 103a and a source SP2 of the P-channel MOSFET of the second inverter 103b are instead conventionally tied to the reference voltage rail GND and to the supply voltage rail VDD, respectively.

In the memory cell's sense and write operating modes, the first switch SWa is turned so as to connect the source SP1 of the P-channel MOSFET P1 to the supply voltage rail VDD, and the second switch SWb is turned so as to connect the source SN2 of the N-channel MOSFET N2 to the reference voltage rail GND.

The memory cell 101 is sensed by asserting the selection signal carried by the selection signal line SEL: by raising the voltage on the selection signal line SEL to a value sufficiently high to turn the selection transistors STa, STb on (for example, bringing the selection signal line to the voltage of the supply voltage rail VDD), the circuit nodes D and DN are connected to the input/output circuit nodes O and ON, respectively. The logic state at the output of the first inverter 103a is thus transferred onto the input/output signal line I/O, and the complementary logic state at the output of the second inverter 103b is transferred onto the input/output signal line I/ON.

The memory cell 101 is written by asserting the selection signal carried by the selection signal line SEL, and by forcing the input/output signal lines I/O and I/ON to a respective potential corresponding to the desired logic state to be stored in the memory cell. For example, in order to write a logic "0" into the memory cell, the input/output signal line I/O is brought to the potential of the reference voltage rail GND, while the input/output signal line I/ON is brought to the potential of the voltage supply rail VDD. In this way, the latch formed by the two inverters 103a and 103b are made to switch to the desired logic state.

The memory cell 101 allows a further operating mode in addition to the sense and write operating modes. Let it be assumed that the memory cell 101 is in a state such that the circuit node D is in the "1" logic state and the circuit node DN is in the "0" logic state. The N-channel MOSFET N2 of the second inverter 103b is thus on. By switching the second switch SWb to the supply voltage rail VDD, a voltage equal to the supply voltage less the threshold voltage of the MOSFET N2 is transferred onto the circuit node DN. This causes the first inverter 103a to switch, so that the potential of the circuit node D is brought to the reference voltage (here GND). The memory cell 101 has thus been cleared, or reset. At the end of the clear operation, the switch SWb is turned back to the reference voltage rail GND. If differently the initial state of the memory cell 101 were such that the circuit node D is in the "0" logic state and the circuit node DN in the "1" logic state, nothing would happen, since the N-channel MOSFET N2 would be off. This is consistent with the fact that a memory cell in such an initial state needs not be cleared, being already in the clear state.

It is to be emphasized that the clearing of the memory cell is not achieved by means of a conventional memory cell's write operation: the memory cell selection signal carried by the selection signal line SEL is not asserted, and the memory cell is kept electrically isolated from the input/output signal lines I/O, I/ON.

The provision of the first switch SWa in addition to the second switch SWb improves the memory cell switching at low supply voltage levels. It must be taken into account that, in order to limit the static power consumption of the memory device, the threshold voltages of the MOSFETs forming the latch structure are not scaled down proportionally to the supply voltage, which may thus reach values comparable with those of the threshold voltages. In such a case, the clearing of the memory cell could be very slow. Assuming again that the memory cell 101 is in an initial state such that the circuit node D is at the "1" logic state, the P-channel MOSFET P1 of the first inverter 103a is on. Turning the first switch SWa to the reference voltage rail GND substantially at the same time the second switch SWb is turned to the supply voltage rail VDD helps the circuit node D to fall to the reference voltage: this causes the P-channel MOSFET P2 to turn on, thus helping the rise toward the supply voltage VDD of the circuit node DN.

It is however worth pointing out that in principle only one of the switches SWa, SWb is required to clear the memory cell.

It is also worth noting that where the memory cell's cleared state conventionally correspond to a memory cell's state opposite to the one so far described, the first and second switches SWa, SWb should be placed in series with the sources SP2 and SN1 of the MOSFETs P2 and N1, the general rule being: place the switches in series to the sources of those MOSFETs of the inverters 103a, 103b that are active when the memory cell is in a non-cleared state.

The memory cell structure of FIG. 1 allows one to easily implement a flash-clear capability in existing SRAM designs without such a feature.

Figure 2:
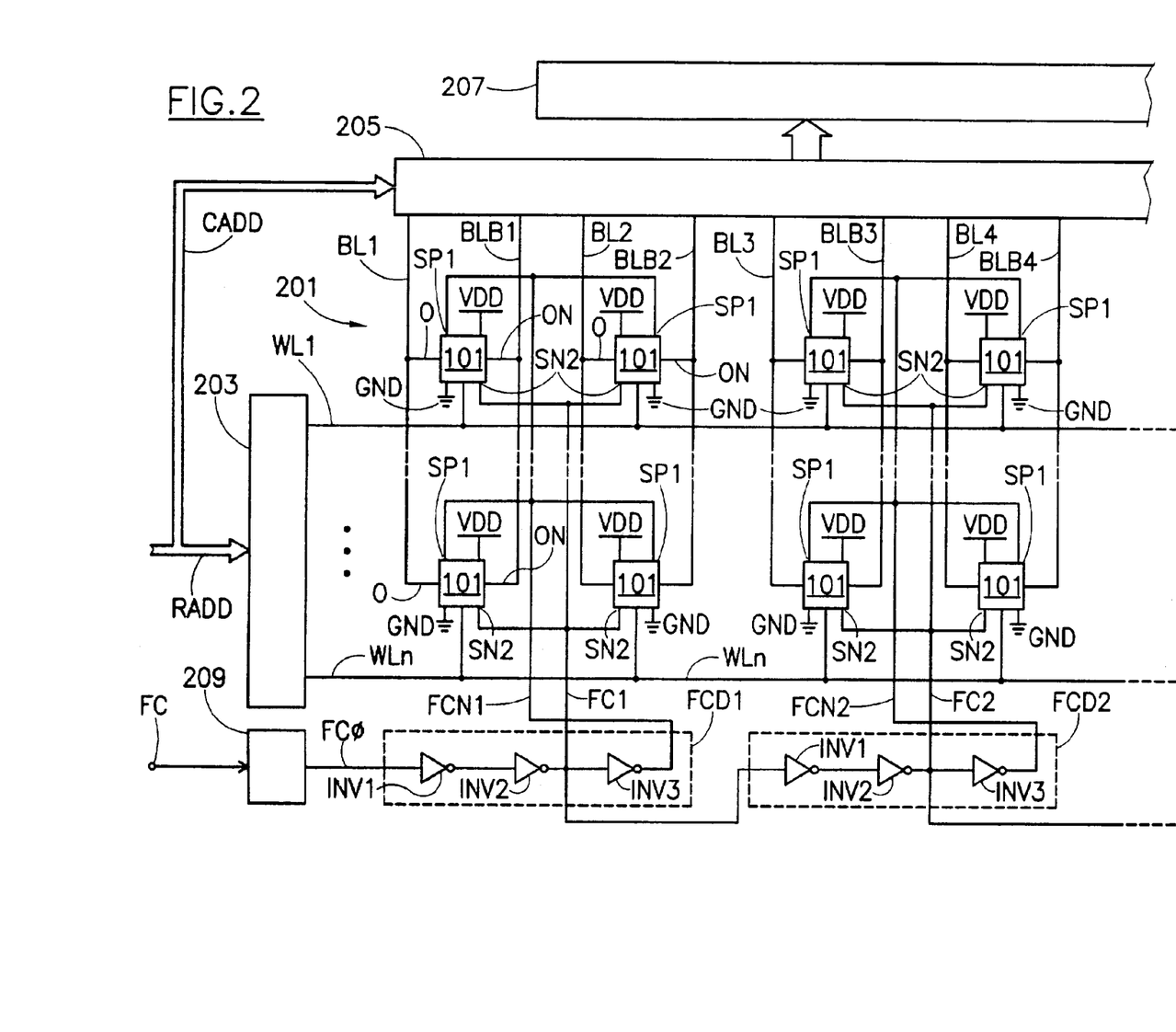
FIG. 2 is a schematic diagram of a portion of an array of SRAM memory cells of the type shown in FIG. 1 according to an embodiment of the invention.

With reference to FIG. 2, a SRAM memory is schematically shown. The memory comprises a memory cell array, identified globally by 201, formed of a plurality of memory cells 101 in a two-dimensional arrangement by rows and columns. The gates of the selection transistors STa and STb of all the memory cells 101 belonging to same row of the array 201 are connected to a same word line WL1–WLn. The input/output circuit nodes O and ON of all the memory cells 101 belonging to a same column of the array 201 are connected to a same pair of bit lines; only four pairs of bit lines BL1, BLB1 to BL4. BLB4 are shown in FIG. 2 for simplicity.

A row address decoder and row selection circuit 203 allows selecting one word line among the plurality of word lines WL1–WLn of the array 201, according to a row address carried by row address signal lines RADD. Similarly, a column address decoder and column selection circuit 205 allows selecting one pair of bit lines among the plurality of bit line pairs BL1, BLB1, BL2, BLB2 etc. of the array 201, according to a column address carried by column address signal lines CADD. The row and column address signal lines RADD and CADD globally carry an address supplied to the memory. Schematically shown as a block 207 are conventional circuits for sensing and writing the memory cells of the array 201.

According to an embodiment of the present invention, the sources SN2 of the N-channel MOSFETs N2 of all the memory cells 101 belonging to a same array column are connected to a same first flash-clear signal line FC1, FC2 etc., and the source SP1 of the P-channel MOSFETs P1 of all the memory cells 101 of a same array column are connected to a same second flash-clear signal line FCN1, FCN2 etc. Preferably, the memory cells 101 of adjacent pairs of array columns share a same pair of first and second flash-clear signal lines FC1, FCN1, FC2, FCN2 etc. The flash-clear signal lines FC1, FC2 etc. and FCN1, FCN2 etc., which are for example metal lines, are typically routed outside the memory cell array 201. The routing of the flash-clear signal lines FC1, FC2 etc. and FCN1, FCN2 etc. depends on the physical layout of the memory cell array.

The pairs of first and second flash-clear signal lines FC1, FCN1, FC2, FCN2 etc. are driven by respective flash-clear signal line driver circuits FCD1, FCD2 etc., connected in cascade to each other. Each driver circuit FCD1, FCD2 etc. comprises a cascaded chain of three inverters INV1, INV2, INV3. The first flash-clear signal line FC1, FC2 etc. of each pair of flash-clear signal lines is connected to an output of the second inverter INV2 of the respective driver circuit FCD1, FCD2 etc.; the second flash-clear signal line FCN1, FCN2 etc. of the pair is connected to an output of the third inverter INV3 of the respective driver circuit. The inverter INV2 and the inverter INV3 perform the function of the switches SWb and SWa, respectively, for all the memory cells 101 of a column pair. An input of the first inverter INV1 of each driver circuit of the cascade of driver circuits is connected to the output of the second inverter INV2 of the preceding driver circuit. A first driver circuit FCD1 of the chain, driving the flash-clear signal lines FC1 and FCN1 shared by the first two columns of the array 201, receives a flash-clear start signal FC0 from a flash-clear controller 209, controlling the activation of the flash-clear operation. The flash-clear controller 209 starts the flash-clear operation upon detection of the assertion of a flash-clear request signal FC, for example a signal external to the memory.

The inverters INV1, INV2 and INV3 of the driver circuits are dimensioned in such a way as to minimise the peak current sunk by the memory device during the flash-clear phase and to have a negligible effect on the stability and access time of the memory cells 101. In particular, a pull-down element of the inverters INV2 and a pull-up element of the inverters INV3 are made sufficiently conductive not to introduce significant resistances in series to the sources of the MOSFETs N2 and P1 in sense and write operating modes.

Figure 3:
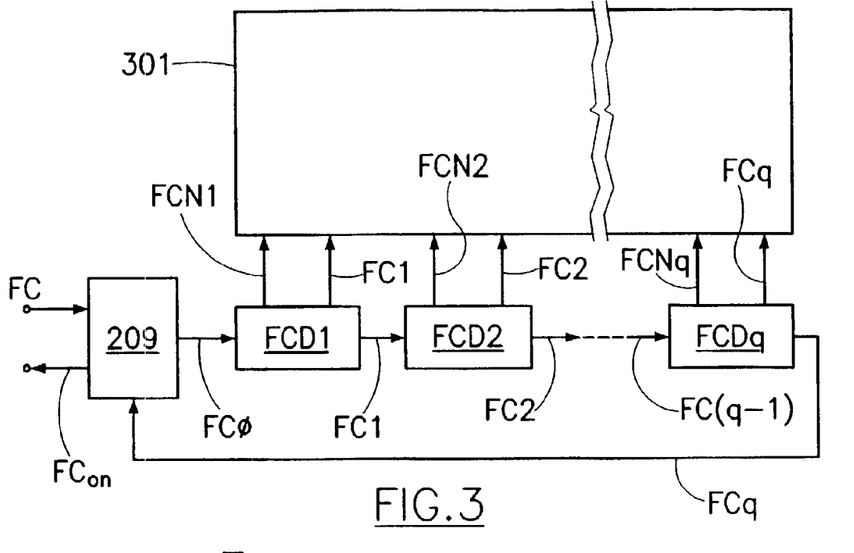
FIG. 3 is a schematic block diagram of a SRAM with an array of memory cells of the type shown in FIG. 1 and a flash-clear control circuit according to an embodiment of the present invention.
Figure 4:
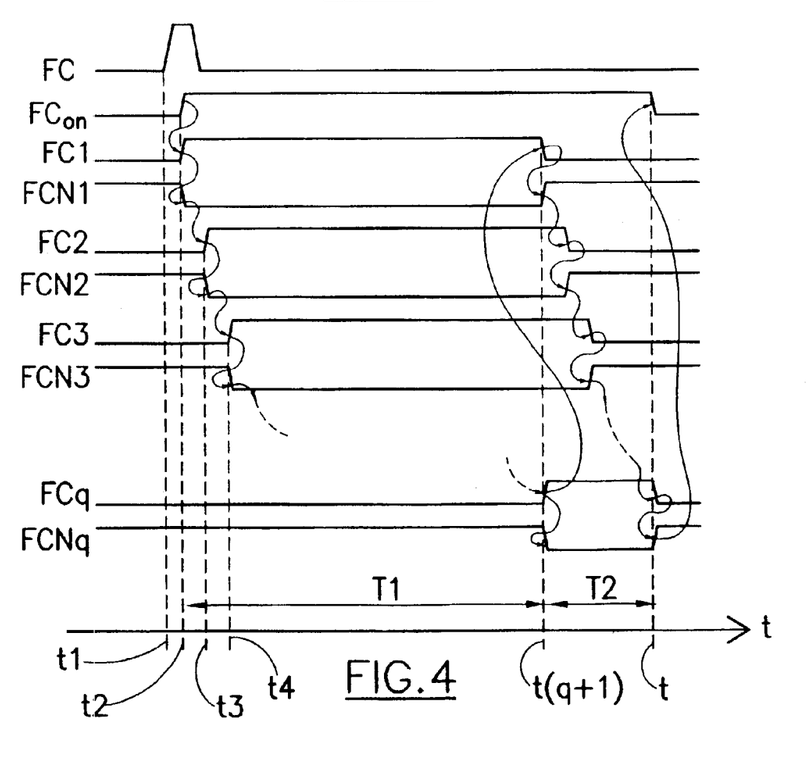
FIG. 4 is a diagram showing the timing of the flash-clear control circuit signals shown in FIG. 3 according to an embodiment of the invention.

The timing of the flash-clear operation will be now explained making reference to FIGS. 3 and 4 according to an embodiment of the invention. In FIG. 3, the memory device of FIG. 2 is shown more schematically, with a block 301 intended to include the memory cell array 201, the row address decoder and row selection circuit 203 and the column address decoder and column selection circuit 205. Blocks FCD1, FCD2, . . . , FCDq represent altogether the plurality of flash-clear signal line driver circuits provided for driving the pairs of flash-clear signal lines FC1, FCN1, FC2, FCN2, . . . , FCq, FCNq of the memory cell array 201. The signal line FCq of the last driver circuit FCDq of the cascade is looped back to the flash-clear controller 209, which uses such a signal to determine the end of the flash-clear operation. The flash-clear controller 209 also controls a signal line FCon, intended to be accessible from outside the memory, for signalling an ongoing flash-clear operation.

Referring to FIG. 4, let it be assumed that at instant t1 the memory receives a flash-clear request (signal FC is asserted). The flash-clear controller 209 detects such a request and asserts the signal FC0, thus starting the flash-clear operation. The flash-clear controller 209 also signals the ongoing flash-clear operation to devices external to the memory by asserting the signal FCon. The flash-clear operation start signal propagates through the cascade of driver circuits FCD1 to FCDq, which acts as a delay line. At instant t2 the first pair of flash-clear signals FC1, FCN1 is thus asserted (the corresponding signal lines are driven high, i.e. to the supply voltage VDD, and low, i.e. to the reference voltage GND, respectively). This causes the memory cells 101 belonging to the first two columns of the array 201 to be cleared. It is to be noted that albeit in FIG. 4 the switching of the signals FC1 and FCN1 is depicted as simultaneous, the signal FCN1 actually switches slightly after the signal FC1, the switching delay corresponding to the switching time of the inverter INV3 of the driver circuit FCD1. At instant t3 the second pair of flash-clear signals FC2, FCN2 switches, causing the memory cells 101 of the second two columns of the array 201 to be cleared; at instant t4 the third pair of flash-clear signals FC3, FCN3 switches, and so on, until at time instant t(q+1) the last pair of flash-clear signals FCq, FCNq switches, causing the memory cells 101 of the last two columns of the array 201 to be cleared. The assertion of the signal FCq signals to the flash-clear controller 209 the fact that the evolution of the flash-clear operation has reached the last pair of columns of the array 201. The flash-clear start signal FC0 is thus deasserted by the flash-clear controller 209 and this causes the progressive deassertion of all the pairs of flash-clear signals FC1, FCN1, FC2, FCN2, FC3, FCN3, . . . , FCq, FCNq. The deassertion of the last flash-clear signal FCq at instant tend is detected by the flash-clear controller 209, which deasserts the signal FCon thus signalling the completion of the flash-clear operation.

It appears that different pairs of memory cell columns of the array are submitted to the flash-clear operation at different instants, according to the propagation of the flash-clear start signal FC0 along the cascade of driver circuits FCD1 to FCDq. This allows the peak current sunk by the memory device to be kept relatively low during the flash-clear operation.

Referring again to FIG. 4, it can be appreciated that while the first pair of memory cell columns is kept in the flash-clear condition for a rather long time interval T1, the subsequent column pairs are kept in the flash-clear condition for time intervals of progressively decreasing length; the last pair of columns is kept in the flash-clear condition for the shortest time interval, indicated as T2. The length of the time interval T2 (reset time) is determined by the time required for the deasserted state of the signal FC0 to propagate along the cascade of driver circuits FCD1, FCD2, . . . , FCDq. The length of the time interval T2 typically must be higher than the time (which could be referred to as memory cell switching time) needed by the memory cells to be flash-cleared, otherwise the memory cells belonging to the last pair of columns are not left sufficient time to switch to the clear state. This condition typically must be satisfied in any operating condition (temperature, voltage supply), memory cell array size and deviation from standard manufacturing process parameters.

Figure 5A:
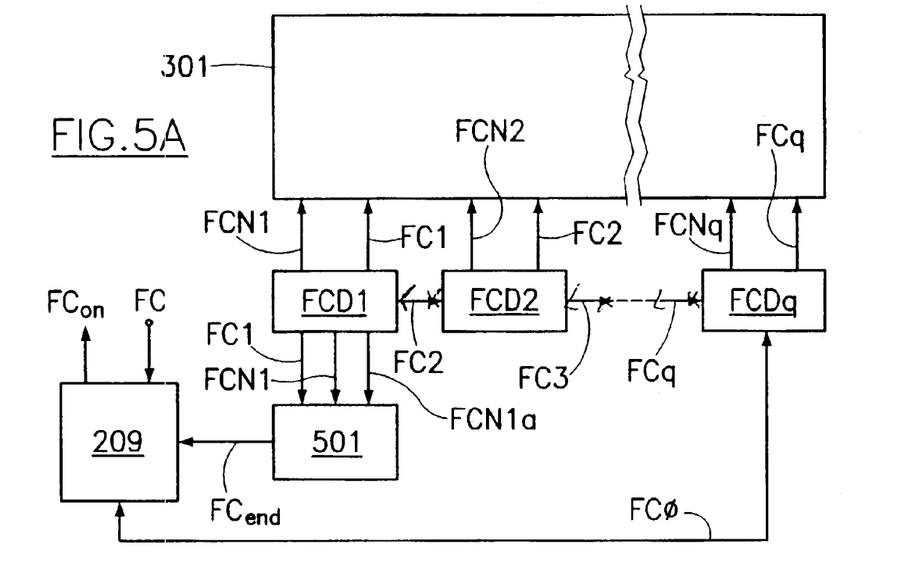
FIG. 5A is a schematic block diagram of a SRAM with an array of memory cells of the type shown in FIG. 1 and a flash-clear control circuit according to another embodiment of the present invention.
Figure 5B:
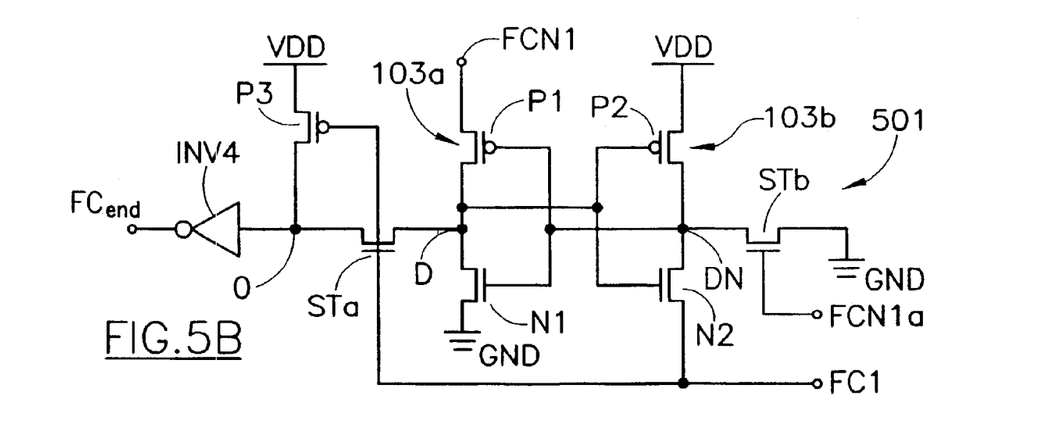
FIGS. 5B and 5C are circuit diagrams of possible practical implementations of two blocks of the control circuit shown in FIG. 5A according to an embodiment of the invention.
Figure 5C:
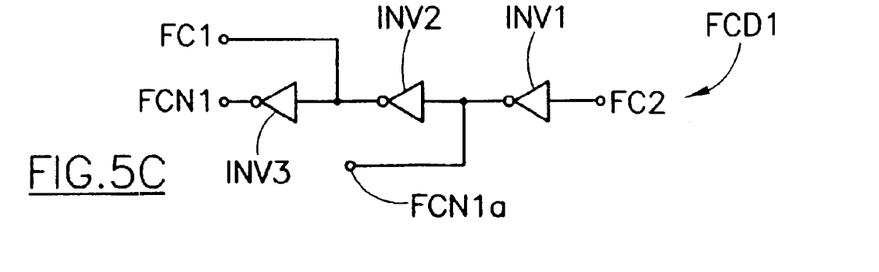

FIGS. 5A to 5C show a SRAM memory with a flash-clear control circuit according to another embodiment of the present invention, which allows overcoming the potential criticality of the flash-clear control circuit of FIG. 3. The flash-clear control circuit according to this embodiment comprises a witness memory cell block 501, including a witness memory cell normally in a non-cleared state (conventionally, the logic "1" state). The witness memory cell block 501, a practical implementation of which is shown in FIG. 5B, includes a SRAM memory cell that is preferably topologically and physically identical to the memory cells 101 of the array 201. The source of the N-channel MOSFET N2 of the witness memory cell is connected to the flash-clear signal line FC1 driven by the last circuit FCD1 of the chain of driver circuits FCD1, FCD2, . . . , FCDq. With respect to the previously described embodiment, the order of the driver circuits FCD1, FCD2, . . . , FCDq in the chain has been reversed: the flash-clear start signal FC0 is supplied to the driver circuit FCDq that, in the drawing, controls the flash clearing of the pair of columns farthest from the flash-clear controller 209; the flash-clear operation proceeds from the farthest columns to the pair of columns close to the flash-clear controller 209. This allows one to place the witness memory cell block 501 close to the flash-clear controller 209. However, it is pointed out that this is not to be intended as a limitation of the present invention, other layout arrangements being possible.

Referring to FIG. 5B, the source of the P channel MOSFET P1 of the witness memory cell is connected to the flash-clear signal line FCN1. The source of the N-channel MOSFET N2 is connected to the flash-clear signal line FC1. The selection transistor STb of the witness memory cell is controlled by a signal FCN1a, logically the complement of the flash-clear control signal FC1, derived from the output of the first inverter INV1 of the last driver circuit FCD1 of the driver circuits' chain (FIG. 5C). The selection transistor STb allows one to electrically connect the circuit node DN of the witness memory cell to the reference voltage GND. The selection transistor STa is controlled by the flash-clear control signal FC1. The circuit node O of the witness memory cell is connected to an input of an inverter INV4; also connected to the circuit node O is a pull-up P-channel MOSFET P3, controlled by the flash-clear control signal FC1, for selectively pulling the circuit node 0 of the witness memory cell up to the supply voltage VDD. The witness memory cell normally is in a state such that the node DN is at the reference voltage GND (logic "0") and the node D is at the supply voltage VDD (logic "1"). In fact, when no flash-clear operation is going on, the flash-clear control signal FC1 is a logic "0" (corresponding to the reference voltage GND), the flash-clear control signal FCN1 is a logic "1" (corresponding to the supply voltage VDD) and the signal FCN1a is also a logic "1". The source of the N-channel MOSFET N2 of the inverter 103b is at the reference voltage GND and the source of the P-channel MOSFET P1 of the inverter 103a is at the supply voltage VDD. The select transistor STb is on, and the circuit node DN is thus at the reference voltage GND; the circuit node D is at the supply voltage VDD. The select transistor STa is off, so that the circuit node D is electrically isolated from the circuit node O, which is kept at the supply voltage VDD by the pull-up MOSFET P3. The signal FCend is thus a logic "0".

Figure 6:
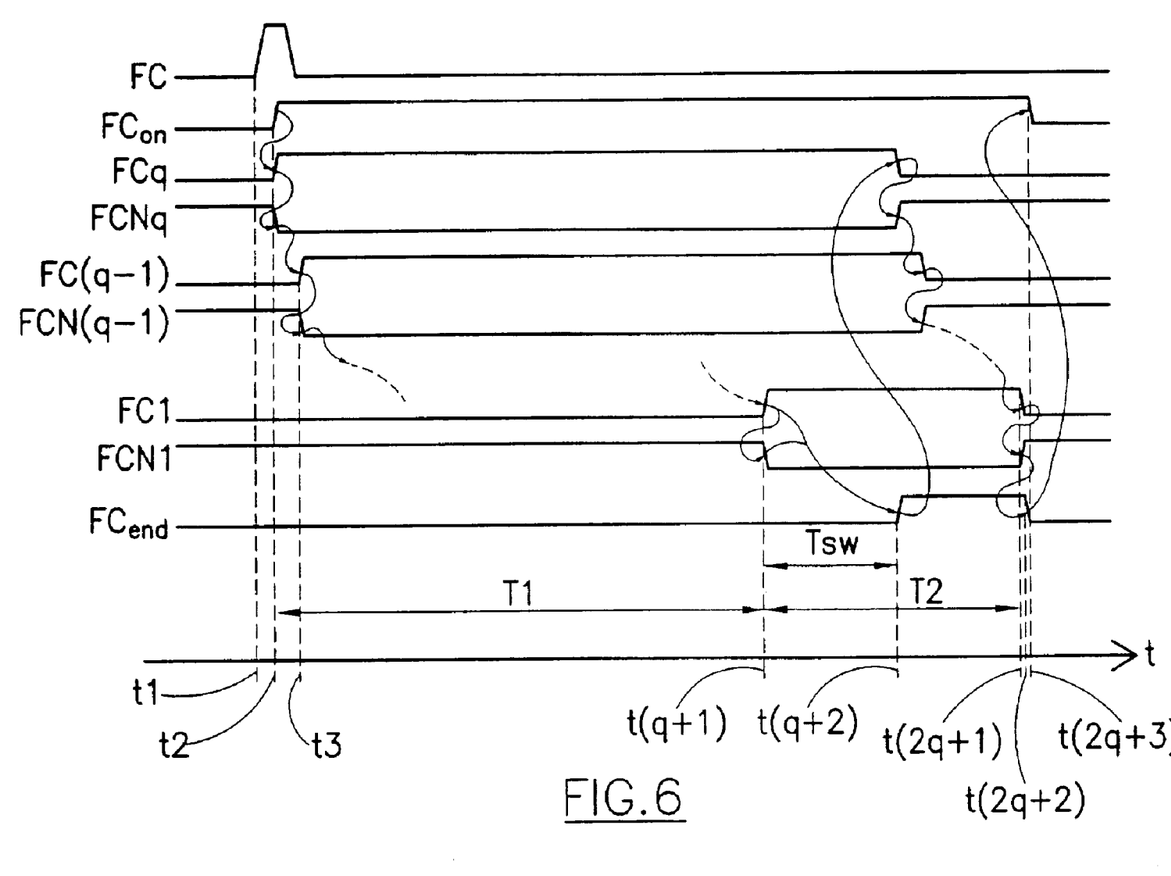
FIG. 6 is a diagram showing the timing of the flash-clear control circuit signals shown in FIG. 5 according to an embodiment of the invention.

Referring to FIG. 6, let it be assumed that at instant t1 the memory receives a flash-clear request (signal FC is asserted). The flash-clear controller 209 detects such a request and asserts the signal FC0, thus starting the flash-clear operation. The flash-clear controller 209 also signals the ongoing flash-clear operation to devices external to the memory by asserting the signal FCon. The flash-clear operation start signal propagates through the cascade of driver circuits FCDq to FCD1, which acts as a delay line. At instant t2 the pair of flash-clear signal FCq, FCNq are thus asserted (the corresponding signal lines are driven high, i.e. to the supply voltage VDD, and low, i.e. to the reference voltage GND, respectively). This causes the memory cells 101 belonging to the last two columns of the array 201 to be cleared. As mentioned in connection with FIG. 4, it is to be noted that albeit in FIG. 6 the switching of the signals FCq and FCNq is depicted as simultaneous, the signal FCNq actually switches slightly after the signal FCq, the switching delay corresponding to the switching time of the inverter INV3 of the driver circuit FCDq. At instant t3 the pair of flash-clear signals FC(q−1), FCN(q−1) switches, causing the memory cells 101 of the two columns of the array 201 preceding the last two columns to be cleared. All the pairs of flash-clear signals are asserted in sequence, until at time instant t(q+1) the last pair of flash-clear signals FC1, FCN1 switches, causing the memory cells 101 of the first two columns of the array 201 to be cleared.

The assertion of the signals FC1 and FCN1 causes the witness memory cell within the witness memory cell block 501 to be cleared. In particular, the switching to the reference voltage GND of the signal FCN1a turns the select transistor STb off, thus disconnecting the circuit node DN of the witness memory cell from the reference voltage GND; the switching to supply voltage VDD of the signal FC1 turns the pull-up MOSFET P3 off and, at the same time, turns the select transistor STa on, thus connecting the circuit node D to the input of the inverter INV4. The signal FCend remains at the reference voltage GND ("0" logic state) until the witness memory cell is cleared: at instant t(q+2), the transition of the signal FCend to the supply voltage VDD ("1" logic state) signals to the flash-clear controller 209 that the witness memory cell has been cleared. The flash-clear controller 209 thus starts the reset sequence, by deasserting the flash-clear start signal FC0; this causes the driver circuits FCDq to FCD1 to sequentially deassert the flash-clear signals FCq, FCNq, . . . , FC1, FCN1; deassertion of the flash-clear signals FC1, FCN1 at instant t(2q+1) causes the witness memory cell to be set to the normal, non-cleared state: the selection transistor STb is turned on so that the circuit node DN is connected to the reference voltage GND; the select transistor STa is turned off and the pull-up MOSFET P3 is turned on, so that the circuit node O is pulled up to the supply voltage VDD: at instant t(2q+2) the signal FCend switches back to the "0" state. The flash-clear operation is thus completed, and the flash-clear controller 209 signals this to the external devices by deasserting the signal FCon (instant t(2q+3)).

Thanks to the fact that the reset sequence is started by the flash-clear controller 209 only after the witness memory cell has been cleared, it is guaranteed that the time interval T2 (representing the time during which the memory cells of the last columns submitted to the flash-clear) is longer than the time Tsw required by a typical memory cell for being cleared.

Thus, a new flash-clear scheme for SRAMs is set forth. This flash-clear scheme allows easily implementing such a function in existing SRAM designs that originally did not include such a feature. In particular, the decoder circuit sections of the existing designs need not be modified to implement the flash-clear function.

The flash-clear scheme not involving any intervention of the row and column address decoders and selectors, also allows a reduction in the memory's current consumption in the flash-clear operation.

Thanks to the fact that such a flash-clear scheme does not require any modification to the decoder circuit sections, no delays are introduced in the normal operation of the memory.

Although in the embodiments discussed in the foregoing two flash-clear signal lines were provided for each pair of memory cell columns of the array, the number of flash-clear signal lines can be different. For example, two flash-clear signal lines could be provided for each memory cell column, or more than two memory cell columns could be associated with a same pair of flash-clear signal lines. As another alternative, instead of grouping the memory cells by columns for flash-clear purposes, the memory cells could be grouped by rows.

It is to be observed that only one flash-clear signal line could be provided for each group of memory cells, instead of a pair of flash-clear signal lines as in the discussed embodiments. In fact, as mentioned in connection with the description of FIG. 1, only one of the sources SP1, SN2 can in principle be switched to clear the memory cell.

The chain of flash-clear signal line driver circuits may be replaced by a shift register (or a pair of shift registers, one for driving the signal lines FC1–FCq, the other for driving the signal lines FCN1–FCNq). More generally, any means for driving different memory cell groups at different times could be used.

It is also underlined that albeit the description provided in the foregoing has been referred to a 6T SRAM cell, this is not to be intended as a limitation of the present invention, which can be applied to any kind of SRAM cell, either dual-port or multi-port.

Although the present invention has been disclosed and described by way of some embodiments, it is apparent to those skilled in the art that several modifications to the described embodiments, as well as other embodiments of the present invention are possible without departing from the spirit and scope thereof.

What is claimed is:

1. A memory device comprising:
   a plurality of memory cells, each one comprising:
     a first and a second inverter connected in a latch configuration, the first and second inverters having respective first and second means for receiving a first and a second voltage supply, respectively;
   characterized by comprising memory cell flash-clear means for switching at least one of the first and second voltage supply receiving means of at least one of the first and second inverters of the memory cells between the first voltage supply and the second voltage supply, for clearing the memory cells,
   wherein the memory cell flash-clear means causes the switching between the first and second voltage supplies of at least one of the first voltage supply receiving means of the first inverter and the second voltage supply receiving means of the second inverter by groups of memory cells of the plurality of memory cells; and
   means for submitting to flash-clear said groups of memory cells in sequence.

2. The memory device according to claim 1, in which said plurality of memory cells comprises an array of memory cells arranged by rows and columns, said groups of memory cells comprising at least one column.

3. The memory device according to claim 2, in which said memory cell flash-clear means comprise, for each group of memory cells:
   at least a first signal line connected to the first voltage supply receiving means of the first inverter of the memory cells of the respective group;
   a driver circuit for switching the first signal line between the first and second voltage supplies;
   and in which a control circuit is provided for controlling the driver circuits.

4. The memory device according to claim 3, in which the driver circuits are connected one to another to form a delay line, a first driver circuit of the delay line receiving from the control circuit a flash-clear start signal propagating along the delay line for sequentially submitting the groups of memory cells to the clear operation.

5. The memory device according to claim 4, in which the propagation of the flash-clear start signal through the delay line is signalled to the flash-clear control circuit by a last driver circuit of the delay line.

6. The memory device according to claim 4, further comprising a witness memory cell normally in a non-cleared state and arranged to be submitted to clearing together with the last group of memory cells of the array, the flash-clear control circuit being operatively coupled to the witness memory cell being so as to detect the clearing thereof, the detected clearing of the witness memory cell determining the end of the clear operation.

7. A memory, comprising:
   first and second supply nodes;
   a first memory cell having first and second power nodes;
   a second memory cell having first and second power nodes;
   a first switch circuit having an input node operable to receive a mode signal and an output node operable to provide the mode signal after a first propagation delay, the first switch circuit operable in response to the mode signal to couple the first power node of the first memory cell to the first supply node during a first mode of operation and to couple the first power node of the first memory cell to the second supply node during a second mode of operation; and
   a second switch circuit having an input node operable to receive the delayed mode signal from the output node of the first switch circuit, the second switch circuit operable in response to the delayed mode signal to couple the first power node of the second memory cell to the first supply node during the first mode of operation and to couple the first power node of the second memory cell to the second supply node during the second mode of operation.

8. The memory of claim 7, further comprising:
wherein the second switch circuit has an output node operable to provide the received mode signal after a second propagation delay; and
a mode-signal generator coupled to the input node of the first switch circuit and to the output node of the second switch circuit, the generator operable to generate the mode signal to initiate the second mode of operation and operable to end generation of the mode signal to end the second mode of operation in response to the delayed mode signal from the second switch circuit.

9. The memory of claim 7 wherein:
the first switch circuit is operable in response to the mode signal to couple the second power node of the first memory cell to the second supply node during the first mode of operation and to couple the second power node of the second memory cell to the first supply node during the second mode of operation; and
the second switch is operable in response to the delayed mode signal to couple the second power node of the second memory cell to the second supply node during the first mode of operation and to couple the second power node of the second memory cell to the first supply node during the second mode of operation.

10. A method, comprising:
isolating the data nodes of first and second memory cells;
changing the contents of the first memory cell while the data nodes are isolated; and
changing the contents of the second memory cell a first delay time after changing the contents of the first memory cell and while the data nodes are isolated.

11. The method of claim 10, further comprising:
wherein changing the contents of the first memory cell comprises changing the contents in response to the setting of a signal;
wherein changing the contents of the second memory cell comprises changing the contents a second delay time after the setting of the signal, the second delay time longer than the first delay time; and
resetting the signal a third delay time after the setting of the signal, the third delay time longer than the second delay time.

12. The method of claim 10, further comprising:
wherein changing the contents of the first memory cell comprises changing the contents in response to the setting of a signal;
wherein changing the contents of the second memory cell comprises changing the contents a second delay time after the setting of the signal, the second delay time longer than the first delay time; and
resetting the signal when the contents of the second memory cell change.

13. The method of claim 10, wherein changing the contents of the first memory cell comprises:
uncoupling a power node of the first memory cell from a first supply node; and
coupling the power node to a second supply node.

14. The method of claim 13, further comprising:
isolating a data node of the first memory cell; and
uncoupling and coupling the power node while the data node is isolated.

15. A memory, comprising:
first and second supply nodes;
a first memory cell having first and second power nodes;
a second memory cell having first and second power nodes;
a first switch circuit having an input node operable to receive a mode signal and an output node operable to provide the mode signal after a first propagation delay, the first switch circuit operable in response to the mode signal to couple the first power node of the first memory cell to the first supply node during a first mode of operation, to couple the first power node of the first memory cell to the second supply node during a second mode of operation, and to clear the first memory cell in response to the mode signal;
a second switch circuit having an input node operable to receive the delayed mode signal from the output node of the first switch circuit and an output node operable to provide the received mode signal after a second propagation delay, the second switch circuit operable in response to the delayed mode signal to couple the first power node of the second memory cell to the first supply node during the first mode of operation, to couple the first power node of the second memory cell to the second supply node during the second mode of operation, and to clear the second memory cell in response to the delayed mode signal;
a dummy memory cell operable to be cleared in response to the delayed mode signal from the output node of the second switch circuit; and
a mode-signal generator coupled to the input node of the first switch circuit, to the output node of the second switch circuit, and to the dummy memory cell, the generator operable to generate the mode signal to initiate the second mode of operation and operable to end generation of the mode signal to end the second mode of operation in response to the clearing of the dummy memory cell.

16. A method, comprising:
isolating the data nodes of first and second memory cells;
changing the contents of the first memory cell while the data nodes are isolated, wherein changing the contents of the first memory cell comprises changing the contents in response to the setting of a signal;
changing the contents of the second memory cell a first delay time after changing the contents of the first memory cell and while the data nodes are isolated, wherein changing the contents of the second memory cell comprises changing the contents a second delay time after the setting of the signal, the second delay time longer than the first delay time;
changing the contents of a dummy memory cell substantially the second delay time after the setting of the signal; and
resetting the signal when the contents of the dummy memory cell change.

* * * * *